United States Patent [19]

Ogita

[11] 4,047,116

[45] Sept. 6, 1977

[54] FM MULTIPLEX STEREO DEMODULATING CIRCUIT

[75] Inventor: Minoru Ogita, Hamamatsu, Japan

[73] Assignee: Nippon Gakki Seizo Kabushiki Kaisha, Hamamatsu, Japan

[21] Appl. No.: 717,389

[22] Filed: Aug. 24, 1976

[30] Foreign Application Priority Data

Aug. 28, 1975 Japan .................. 50-103429

[51] Int. Cl.² .................. H03D 3/00; H04H 5/00
[52] U.S. Cl. .................. 329/124; 179/15 BP; 179/15 BT; 329/111; 329/112; 329/145; 329/167
[58] Field of Search .................. 329/110–112, 329/122, 124, 125, 136, 145, 167, 168, 169; 179/15 BP, 15 BT; 325/349, 364, 476, 487

[56] References Cited

U.S. PATENT DOCUMENTS

| | | | |
|---|---|---|---|
| 3,974,453 | 8/1976 | Ohsawa | 329/112 X |
| 3,980,832 | 9/1976 | Nakamura et al. | 179/15 BT |
| 4,002,991 | 1/1977 | Ogita | 329/110 X |

Primary Examiner—Siegfried H. Grimm
Attorney, Agent, or Firm—Cushman, Darby & Cushman

[57] ABSTRACT

An FM multiplex stereo demodulating circuit for obtaining separated left and right channel signals from a composite signal containing a stereophonic signal and a pilot signal, wherein the pilot signal component in the composite signal to be applied to a multiplex demodulator is cancelled by an inverted pilot signal, thereby expanding the frequency range and decreasing the carrier leak. The inverted pilot signal is produced by a sub-carrier generating circuit comprising a phase locked loop circuit and a phase shifter.

6 Claims, 1 Drawing Figure

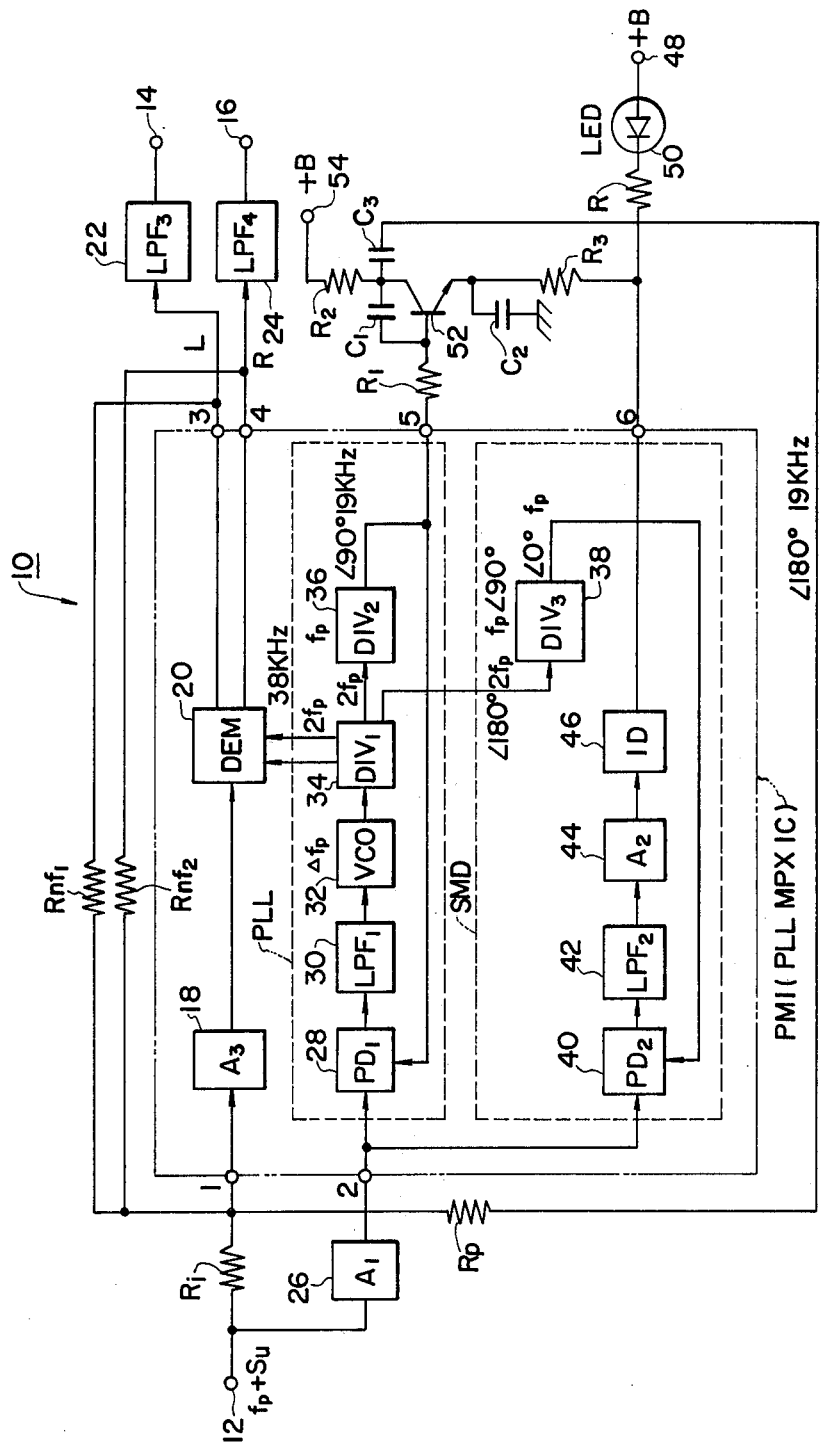

FM MULTIPLEX STEREO DEMODULATING CIRCUIT

BACKGROUND OF THE INVENTION a. Field of the Invention

The present invention relates to an FM multiplex stereo demodulating circuit, and more particularly to a demodulating circuit utilizing a sub-carrier generating circuit which comprises a so-called phase locked loop.

b. Description of the Prior Art

In the conventional FM multiplex stereo demodulating circuit, a pair of low-pass filters having a cut-off frequency of 15 kHz are provided in order to eliminate the pilot signal of 19 kHz, which is contained in the input of the demodulator of the switching circuit and is unnecessary for the audio output signal, from said input of the demodulator by sufficiently attenuating the frequency components of the 19 kHz pilot signal. To this end, each one of the pair of low-pass filters must have a steep cut-off characteristic, and such a low-pass filter has to be provided in each of the left and the right channels of the stereophonic signal channels. However, in the conventional FM multiplex stereo demodulating circuit as mentioned above, accuracy of electrical values of the component parts is severely required since the more the cut-off characteristic of the low-pass filter is made steep, the more easily the filter characteristic exhibits ripples in the audio frequency band. Moreover, the central frequency $f_0$ of each low-pass filter must be precisely adjusted. Instead of a pair of the low-pass filters, it is possible to use a band-rejection filter at 19 kHz which is to be connected to the input terminal of the multiplex stereo demodulating circuit. However, this system is of no practical use since the separation characteristic will considerably deteriorate, though it has the advantage that only one filter is enough for the elimination of the 19 kHz pilot signal.

SUMMARY OF THE INVENTION

It is, therefore, a primary object of the present invention to provide an FM multiplex stereo demodulating circuit capable of eliminating, by a simple construction, the 19 kHz pilot signal component which is applied to the input terminal of the demodulator of a switching circuit type.

Another object of the present invention is to provide an FM multiplex stereo demodulating circuit capable of simplifying the necessary low-pass filters.

Still another object of the present invention is to provide an FM multiplex stereo demodulating circuit capable of improving carrier leak and a frequency response.

The foregoing objects of the present invention are attained by providing a demodulator of a switching circuit type, a phase locked loop circuit, i.e. a PLL circuit, which generates a signal of 38 kHz for switching the demodulator and a 19 kHz signal, a stereo-monaural detecting circuit and a phase shift circuit for shifting the phase of the 19 kHz signal to 180° under the control of the stereo-monaural detecting circuit and for applying the shifted signal to an input terminal of the demodulator.

These and other objects as well as the features of the present invention will become more apparent to those skilled in the art as the disclosure is made in the following description of a preferred embodiment of the present invention, as illustrated in the accompanying drawing.

BRIEF DESCRIPTION OF THE DRAWING

The drawing shows a block diagram of an FM multiplex stereo demodulating circuit for explaining the basic concept of the present invention.

DETAILED DESCRIPTION OF THE PREFERRED EMBODIMENTS

Referring now to the drawing, there is shown an FM multiplex stereo demodulating circuit 10 according to the present invention. In the drawing, reference numeral 12 designates an input terminal to which a composite signal containing a pilot signal $f_p$ and other signals $S_u$ (modulated stereophonic signal) are applied from the FM detector or discriminator and reference numerals 14 and 16 designate output terminals. As the system from an antenna to the input terminal 12 may follow the commercial FM receiver practice, necessary parts or circuits such as the antennas, intermediate frequency amplifier and FM detector or discriminator are not shown in the drawing. Reference numeral 18 designates a preamplifier for amplifying the composite signal ($f_p$ + $S_u$) supplied from the input terminal 12 through a resistor $R_i$ and a terminal 1, and reference numeral 20 designates an FM multiplex demodulator or switching circuit to separate the right and left channel signals. The separated left and right channel signals are applied to the output terminals 14 and 16 through terminals 3 and 4 and low-pass filters 22 and 24 respectively.

Reference numeral 26 designates a buffer amplifier which is connected between the input terminal 12 and a first phase detector 28 through a terminal 2. Reference numeral 30 designates a low-pass filter and reference numeral 32 designates a voltage controlled oscillator, the oscillating frequency of which is controlled by the output voltage of the low-pass filter 30. Reference numeral 34 designates a first frequency divider which divides the output frequency of the voltage controlled oscillator 32 into a desired frequency at a predetermined dividing ratio. Reference numeral 36 designates a second frequency divider which divides the output frequency of the first frequency divider 34 into a desired frequency at a predetermined dividing ratio. The output frequency of the second frequency divider 36 is applied to one of the input terminals of the first phase detector 28. By means of these circuits 28 through 36, a phase locked loop circuit PLL shown by a dotted line is constituted as a sub-carrier generating circuit, which is arranged so that it detects a voltage proportional to the frequency or phase difference between the signal from the input terminal 12 and the signal from the second frequency divider 36 and that the voltage is fed back to the voltage-controlled oscillator 32 through the low-pass filter 30.

Reference numeral 38 designates a third frequency divider which divides the output frequency of the first frequency divider 34 ito a desired frequency at a predetermined dividing ratio. Reference numeral 40 designates a second phase detector having two separate input terminals. The input signal or the composite signal ($f_p$ + $S_u$) from the input terminal 12, which is amplified by the buffer amplifier 26, is applied to one of the input terminals of the second phase detector 40 and the output signal from the frequency divider 38 is applied to the other of the input terminals. Reference numeral 42 designates a low-pass filter and reference numeral 44 designates a direct current amplifier which operates in response to the output level of the low-pass filter 42.

Reference numeral 46 designates an indicator driving circuit which drives an indicator by the output voltage thereof. These circuits 38 through 46 constitute a stereo-monaural detecting circuit SMD shown by a dotted line in the drawing.

The multiplex demodulator 20 is arranged so that it is switched by the switching carrier with a frequency $2f_p$ or 38 kHz two times as high as $f_p$ from the first frequency divider 34. The preamplifier 18, the multiplex demodulator 20, the phase locked loop circuit PLL and the stereo-monoaural detecting circuit constitute a phase-locked-loop-and-multiplex integrated circuit PML with the terminals 1 through 6. As shown in FIG. 1 and described before, the terminal 1 is connected to the input terminal 12 through the resistor $R_i$ and is also connected to the input terminal of the preamplifier 18. The terminal 2 is connected to the output terminal of the buffer amplifier 26 and is also connected to the respective input terminals of the first and second phase detectors. The terminals 3 and 4 are connected to the respective output terminals of the multiplex demodulator 20 and are also connected to the respective output terminals 14 and 16 through the low pass filters 22 and 24. The terminals 3 and 4 are connected to the terminal 1 respectively via feed back resistors $Rnf_1$ and $Rnf_2$. The terminal 5 is connected to the output terminal of the frequency divider 36 and the terminal 6 is connected to both the indicator driving circuit 46 and the positive terminal 48 of an electric power source (+B) through a resistor R and light emission element 50 such as a light emitting diode.

The reference numeral 52 designates a transistor, the collector electrode of which is connected to another positive terminal 54 of the electric power source (+B). The collector electrode of the transistor 52 is also connected to the base thereof through a capacitor $C_1$ and to the terminal 1 of the phase-locked-loop-and-multiplex integrated circuit PMI through a capacitor $C_3$ and the resistor $R_p$. An emitter electrode of the transistor 52 is connected to the terminal 6 of the phase-locked-loop-and-multiplex integrated circuit PMI through the resistor $R_3$ and is grounded through a capacitor $C_2$. The base electrode of the transistor 52 is connected to the terminal 5 of the phase-locked-and-multiplex integrated circuit PMI through a resistor $R_1$. These elements including the transistor 52, the capacitor $C_1$ through $C_3$ annd the resistors $R_1$ and $R_2$ constitute a phase shifting circuit. Partially, the transistor 52, the resistor $R_1$ and the capacitor $C_1$ constitute an integrator.

Operation of the FM multiplex stereo demodulating circuit 10 according to the present invention is as follows. Since the output terminal of the indicator driving circuit 46 is not grounded under the condition that the phase locked loop circuit PLL is not locked or synchronized, any electric current from the electric power source (+B) will not flow through the light emission element 50. However, when the phase locked loop circuit PLL is locked or synchronized with a specific signal such as the pilot signal of 19 kHz which is contained in the input composite signal, the output terminal of the indicator driving circuit 46 of the stereo-monaural detecting circuit is grounded and, thus, the electric current from the electric power source (+B) flows through the light emission element 50. Therefore, in the event that the phase locked loop circuit is in its locked state, the light emission element 50 emits light so as to indicate the reception of the stereophonic signal.

As is apparent from the foregoing description, the transistor 52 is rendered conductive when the phase locked loop circuit is locked, and is maintained in its "ON" state during the reception of the stereophonic signal, since the terminal 6 is maintained at zero potential during the period of such reception.

The pilot signal $f_p$ of 19 kHz with a phase angle of 90° with respect to the phase angle of the input $f_p$ from the second frequency divider 36 of the phase locked loop PLL is applied through the terminal 5 to the integrator consisting of the transistor 52, the resistor $R_1$ and the capacitor $C_1$. A circuit comprising the transistor 52, the resistors $R_1$ through $R_3$ and the capacitor $C_2$ forms an amplifier which is controlled by the output of the stereo-monaural detecting circuit. As is explained before, since the operation of the transistor 52 is controlled by the output level of the stereo-monaural detecting circuit, the pilot signal of 19 kHz with the phase angle of 180° with respect to the input $f_p$ is produced at the collector electrode of the transistor 52 by the operation of the integrator only while the transistor 52 is in its "ON" state, i.e. during the period of the reception of the stereophonic signal.

The phase-shifted pilot signal having a phase angle of 180° applied to the terminal 1 of the phase-locked-loop-and-multiplex integrated circuit PMI through the capacitor $C_3$ and the resistor $R_p$, and is applied to the input terminal of the demodulator 20 after being amplified by the preamplifier 18. Therefore, the pilot signal $(f_p)$ contained in the composite signal $(f_p + S_u)$ is cancelled by the 180° shifted pilot signal from the phase shifting circuit, and thus the composite signal $(S_u)$ without the pilot signal $(f_p)$ is applied to the input of the demodulator 20. The signal $S_u$, i.e. the modulated stereophonic signal, which is applied to the demodulator 20 is separated into left channel and right channel audio signals by the demodulator 20 which is successively switched by the switching carrier of 38 kHz from the first divider 34 of the phase locked loop circuit PLL. These separated left and right channel signals are applied to the low-pass filter 22 and 24 respectively and thus the demodulated stereophonic signals are obtained at the output terminals 14 and 16. It is apparent from the foregoing description that the carrier leak after the multiplex demodulation is considerably decreased since the pilot signal which is transmitted during the multiplex stereophonic broadcast is cancelled. While the frequency range of the conventional demodulating circuit is up to 15 kHz due to the use of low-pass filters having a cut-off frequency of approximately 15 kHz for eliminating the 19 kHz pilot signal from the audio stereophonic signal, it is possible, according to the present invention, to extend the range of the frequency range up to approximately 19 kHz since the cut-off frequency of each of the low-pass filters 22 and 24 can be designed at higher frequency than 20 kHz. Furthermore, according to the present invention, it is unnecessary to adjust the central frequency $f_0$ of each low-pass filter in order to cancel the 19 kHz pilot signal. Moreover, since it is unnecessary to attenuate the 19 kHz pilot signal by means of the low-pass filters, steep cut-off characteristic of the low-pass filters is not required. Therefore, each low-pass filter can be simplified in construction with less constitutional parts and be made at low cost.

In the embodiment described heretofore, the pilot signal with a phase shift of 180° for cancelling the pilot signal applied to the input terminal of the demodulating circuit 10 is obtained by applying the pilot signal with a phase shift of 90°, which is produced by the second frequency divider 26 of the phase locked loop circuit PLL, to the integrator. However, the present invention is not limited to this embodiment. For example, the pilot signal with a phase shift of 180° may be obtained by directly applying the pilot signal with a phase shift 0°, which may be produced by the second frequency divider to the ivnerter amplifier transistor 52, the operation of which is controlled by the output level of the stereo-monaural detecting circuit SMD.

I claim:

1. An FM multiplex stereo demodulating circuit for obtaining separated left and right channel signals from a composite signal containing a modulated stereopnonic signal and a pilot signal of a certain freqeuncy, comprising:
    a multiplex demodulator having an input for receiving said composite signal,
    a sub-carrier generating circuit comprising a phase locked loop circuit which produces a first sub-carrier signal for driving the demodulator and a second signal of said certain frequency, said generating circuit having an input for receiving said composite signal,
    a stereo-monaural detecting circuit, having a first input for receiving said composite signal and a second input for receiving said second signal,
    a phase shift circuit for shifting the phase of said signal of said certain frequency from said sub-carrier generating circuit so that the phase angle thereof is inverted with respect to that of said pilot signal, the operation of the phase shift circuit being controlled by the output level of the stereo-monaural detecting circuit, and
    means for applying the inverted signal of said certain frequency from said phase shift circuit to said multiplex demodulator so that the pilot signal contained in the composite signal is cancelled by the phase-inverted signal of said certain frequency.

2. An FM multiplex stereo demodulating circuit for obtaining separated left and right channel signals from a composite signal containing a modulated stereophonic signal and a pilot signal of a certain frequency comprising:
    a demodulator circuit having an input and first and second output signals comprising said separated left and right channel signals;
    means for connecting said modulated and pilot signal to said input;
    means for receiving said modulated and pilot signals and producing a cancellation signal which is identical to and 180° out of phase with said pilot signal; and
    means for applying said cancellation signal to said input.

3. An FM demodualting cirucit as in claim 2 wherein said demodulating circuit includes a preamplifier having an input for receiving said composite signal and an output, an FM multiplex demodulator having an input connected to the output of said preamplifier for separating right and left channel signals and first and second low pass filters for receiving the separated signals and applying the separated and filtered signals to respective output terminals.

4. An FM demodulating circuit as in claim 2, wherein said receiving and producing means includes a phase shift circuit for shifting the phase of said pilot signal comprising a first phase detector, a low pass filter connected to the output of said first phase detector, a voltage controlled oscillator connected to the output to said low pass filter, a first frequency divider connected between said demodulator circuit and the output of said oscillator, and a second frequency divider connected to the output of said first divider.

5. An FM demodulating circuit as in claim 2, further including a monaural detecting circuit connected to said demodulator circuit.

6. An FM multiplex stereo demodulating circuit for obtaining separated left and right channel signals from a composite signal containing a modulated stereophonic signal and a pilot signal of a certain frequency comprising:
    a switch type demodulator for receiving said composite signal at an input, and producing said left and right signals at an output;
    a phase locked loop circuit for receiving said composite signal, and generating a signal at twice said certain frequency for switching said demodulator and for separating said pilot signal from said composite signal; and
    means for shifting the phase of said pilot signal by 180° and applying the shifted signal to said input of said demodulator.

* * * * *